United States Patent [19]

Brewer

[11] Patent Number: 5,140,189
[45] Date of Patent: Aug. 18, 1992

[54] WSI DECODER AND PATCH CIRCUIT

[75] Inventor: Joe E. Brewer, Severna Park, Md.

[73] Assignee: Westinghouse Electric Corp., Pittsburgh, Pa.

[21] Appl. No.: 749,837

[22] Filed: Aug. 26, 1991

[51] Int. Cl.$^5$ .......................................... H03K 19/003
[52] U.S. Cl. ................................... 307/441; 307/219; 307/465
[58] Field of Search ........................ 307/441, 219, 465

[56] References Cited

U.S. PATENT DOCUMENTS 4,800,302 1/1989 Marum ................................ 307/441

OTHER PUBLICATIONS

"WSI Signal and Data Processor Development", Joe E. Brewer et al., GOMAC Proceedings 1988, four pages.
"8 Megabit Wafer Scale SRAM", Ron Bourassa et al, GOMAC Proceedings, 1989, pp. 1-4.
"Development of Avionics Based on WSI Technology", Joe E. Brewer, Avionics Technical Symposium, Naval Post Graduate School, Nov. 1989, pp. 1-5.
"WSI Modular Packaging", Joe E. Brewer et al, Proceedings of Internation Symposium ... System Integration Conference, Nov., 1990, pp. 1-12.
"Practical Considerations for WSI Based Systems" Joe E. Brewer, International Conf. on Wafer Scale Integration, Jan., 1991, pp. 1-7.

*Primary Examiner*—David Mis
*Attorney, Agent, or Firm*—D. Schron

[57] ABSTRACT

Externally formed connections are made to a wafer scale integration (WSI) type of semiconductor device to accomplish wafer level defect avoidance and includes the utilization of a relatively small external shorting block or patch circuit for implementing predetermined shorting connections, such as jumpers, on a diode decoder circuit on the wafer to program an address of a defective primary site into a register associated with a predetermined spare site for substituting the spare site for a defective primary site when power is applied to a fully processed WSI wafer having (n+r) sites including (n) primary sites and (r) spare sites and where n primary sites are required to perform a predetermined circuit function.

15 Claims, 5 Drawing Sheets

WSI DECODER AND PATCH CIRCUIT

BACKGROUND OF THE INVENTION

1. Field of the Invention

This invention relates generally to wafer scale integration type of semiconductor circuitry and more particularly to means for defining which working sites on a processed wafer of a wafer scale integration type semiconductor structure are to be used.

2. Description of the Prior Art

Wafer scale integration (WSI) technology is an effort to achieve higher density by fabricating complete signal and data processors, for example, on a single large monolithic wafer of silicon or gallium arsenide which formerly would occupy several circuit cards. The wafer consists of a number of identical sites comprised of many discrete devices which are to be connected together to form a desired circuit function. Some WSI wafers are comprised of more than one type of site.

Inherent in any processed WSI wafer are the existence of non-working or defective sites which occur before, during or after manufacture, including testing and burn-in. As a result, a certain amount of site redundancy is built into the wafer by providing for a predetermined number of primary sites and a number of extra or spare sites. The number of primary sites is the exact number needed for a required function while the spares are provided to allow for defects. The acceptable yield is thus dependent upon some repair or defect avoidance technique employed to by-pass faulty sites and make suitable connections to functional sites. Notwithstanding that a given repair strategy is used to provide very high yields, the existence of faults, i.e. defective sites, may still be undetectable at repair time or may be introduced after repair time.

A variety of approaches have been resorted to in the past for providing for defect avoidance at some point in the fabrication process. The so-called discretionary wiring technique resorted to by some fabricators failed largely because of flaws introduced during the formation of the discretionary masks and subsequent processing. One approach to avoid a great deal of post processing repair was by making laser repairs after the circuit had been mounted in a package. This approach went far in minimizing the problem, but even there retesting had to be performed over and over again to guard against loss. Conventional practice now employed is to achieve defect avoidance using discretionary elements within the monolithic device itself. Examples of such elements include links of material which can be cut by laser, materials which can be welded together by laser, materials which can be deposited in a discretionary manner, or electronically controlled switches. They all share the same, and in some cases undesirable, characteristic of being an integral part of the monolithic structure.

Thus all strategies for the fabrication of wafer scale integrated type of semiconductor devices recognize that defective sites will exist on wafers and that some means must be provided for achieving an operational circuit in the presence of those defects. The operations performed for the purpose of defect management or defect avoidance can appear in the wafer processing sequence at any time after circuit function can be observed. The nearer this defect management or defect avoidance step occurs to the final fabrication step the better because any processing performed thereafter can introduce fatal defects. Accordingly, the logical choice would be to delay defect management and avoidance until after all processing and assembly operations have been completed.

SUMMARY

Accordingly, it is an object of the present invention to provide an improvement in defect avoidance schemes for the selection of working sites on a monolithic semiconductor device.

It is a further object of the invention to provide an improvement in defect avoidance of sites on a wafer scale integration type of semiconductor device by delaying the making of connections until all wafer processing has been completed.

It is another object of the invention to provide an improvement in defect avoidance schemes by physically locating the means for selection of a set of working sites on a wafer externally of the wafer.

Briefly, the foregoing and other objects are achieved by making externally formed connections to a wafer scale integration (WSI) type of semiconductor device to accomplish wafer level defect avoidance and comprises the utilization of a relatively small external shorting block or patch circuit for the definition of which spare sites are to be used. The patch circuit is used in combination with a decoder circuit which is coupled to a predetermined number (r) of spare sites on a fully processed WSI wafer additionally including (n) primary sites through a flat multilayer flexible cable also acting as a low impedance power, ground and signal distribution network. The decoder has one enabling output for each spare site so that connections completed by the shorting block or patch assign a logical address for a defective primary site to a designated spare site. A register exists on the wafer for every spare site, with the settings programmed by the shorting block being stored in the registers. Control circuitry also exists in the wafer to electrically remove one or more defective primary sites and to activate a required number of spare sites which operate as replacement sites for the defective primary sites.

BRIEF DESCRIPTION OF THE DRAWINGS

The following detailed description of the invention will be more readily understood when considered in conjunction with the accompanying drawings wherein.

DETAILED DESCRIPTION OF THE INVENTION

Figure 1:
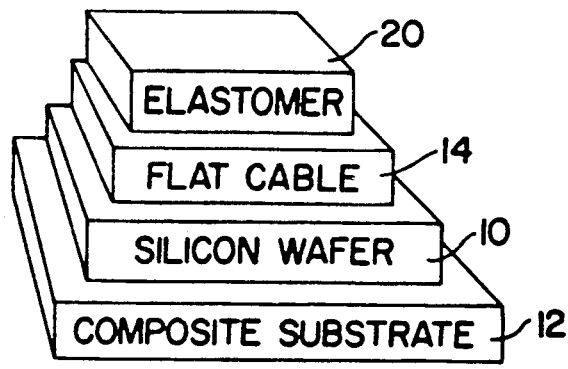
FIG. 1 is a block diagram broadly illustrative of one type of packaging for wafer scale integration circuitry.
Figure 3:
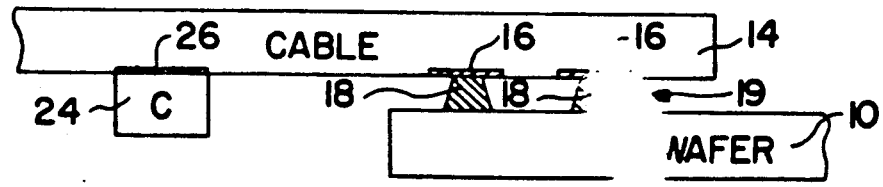
FIG. 3 is a partial side elevational view generally illustrative of pad-bump interconnect scheme employed between the cable and wafer components shown in FIGS. 1 and 2.

Referring now to the drawings and more particularly to FIG. 1, shown thereat is a diagram illustrating the relationship of components utilized in known prior art wafer scale integration (WSI) technology wherein a silicon wafer 10 comprised of a sealed surface device including a plurality of working sites, not shown, is mounted on a carbon fiber composite substrate 12 which provides mechanical support and heat removal for the wafer 10. The thermal expansion properties of the composite substrate 12 are matched to that of silicon which is also the material from which the wafer 10 is fabricated. This is to ensure long term reliability. Electrical connections are made to the top surface of the wafer 10 by a multilayer flat cable 14. Controlled impedance signal lines, power and ground planes within the cable connect to multiple points over the surface of the wafer 10 by means of a set of metallic pads 16 and bumps 18 forming a pad-bump interface 19 at the adjoining surfaces as shown in FIG. 3 and provide a near zero impedance power source. Additionally, a layer 20 of elastomeric material is placed over the top surface of the multilayer cable 14 to provide contact pressure for the wafer and cable interconnection and to also compensate for non-flatness between the elements when a clamping device, not shown, is applied.

A more recent packaging approach has evolved from that shown in FIG. 1 and comprises bringing two wafers $10_1$ and $10_2$ mounted on respective separate composite substrates $12_1$ and $12_2$ together to form a sandwich structure 22 where the composite substrates $12_1$ and $12_2$ are the outside members, while the wafers $10_1$ and $10_2$ and their respective flat cables $14_1$ and $14_2$ share a common intermediate elastomer layer 20. Further, as shown, both multilayer flat cables $14_1$ and $14_2$ include an adjacent decoupling capacitor $24_1$ and $24_2$ which are employed to control and by-pass power supply noise so that it cannot reach the wafer circuitry. It is also connected to its respective cable 14 by a metallized pad 26 as shown in FIG. 3.

Figure 2:
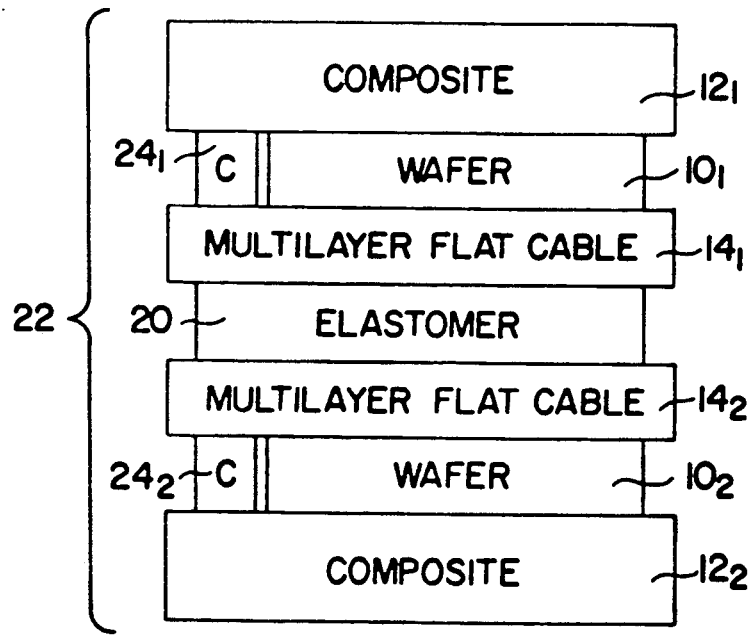
FIG. 2 is a block diagram further illustrative of wafer scale integration technology which is in the form of a scheme referred to as dual composite packaging.

The modular structure 22 as shown in FIG. 2 is particularly advantageous since it not only results in a significant saving in volume and weight, it allows the outer composite substrates $12_1$ and $12_2$ to serve as covers which allows assembly 22 to be handled without damage, while protecting the inside surfaces which include the wafers and cables. An important feature of this arrangement is that the assembly 22 can be opened when necessary without harmful effects. At any time during manufacture, individual devices can be accessed for examination and/or repair without damaging other devices. Flexible cables can also be removed and replaced without harming the wafers. Furthermore, modules which experience failures during manufacturing tests or burn-in can be readily reworked.

Figure 6:
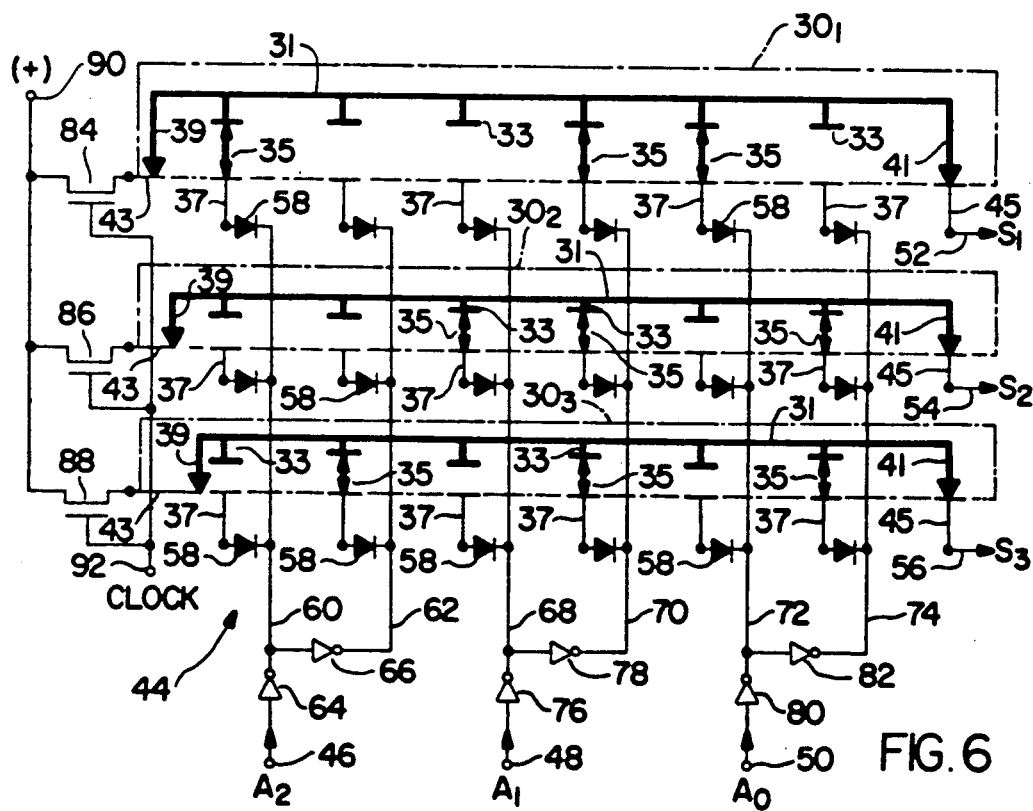
FIGS. 6, 7 and 8 depict alternative specific implementations of a diode decoder and a patch circuit utilized with the allocation circuit shown in FIG. 5.
Figure 7:
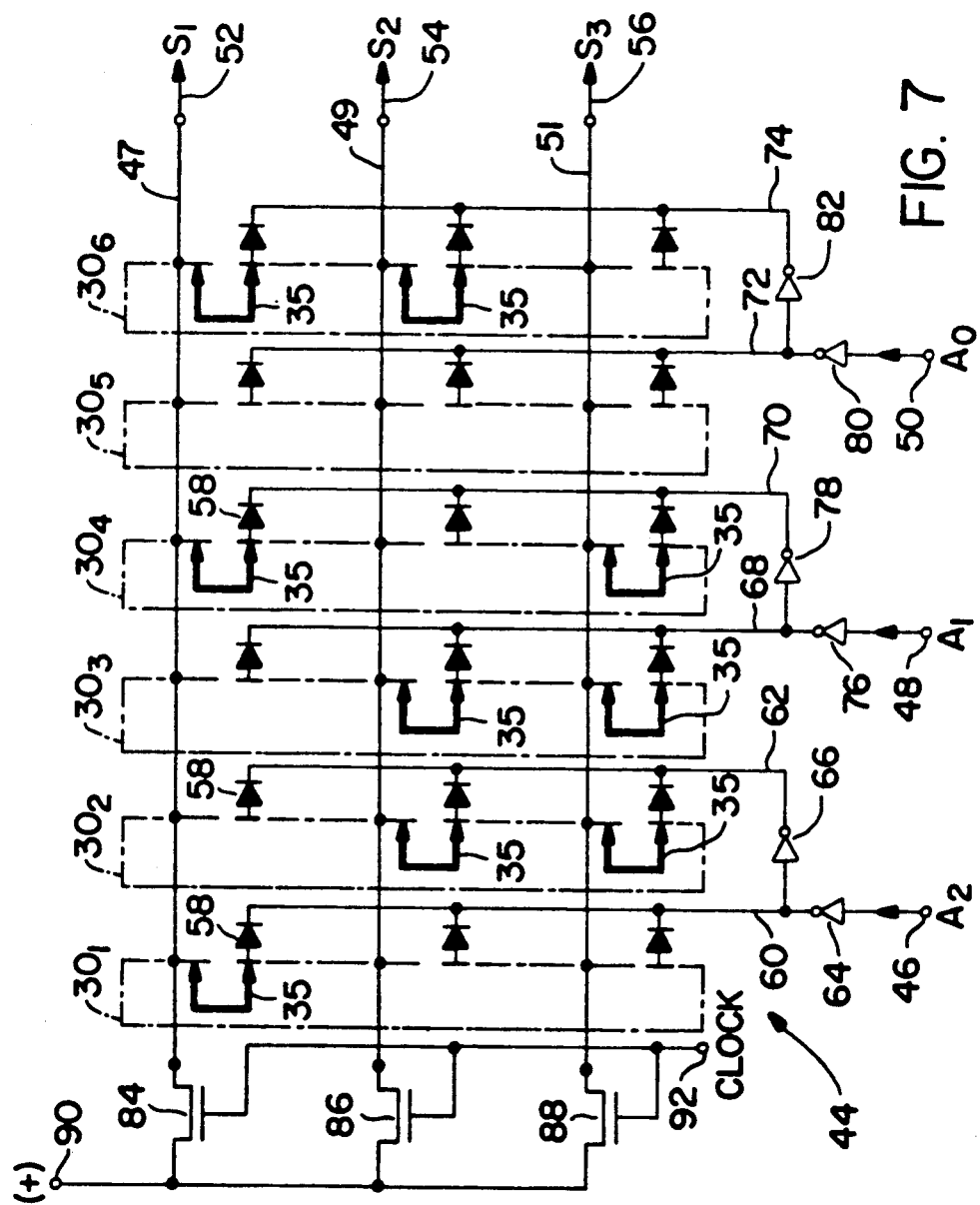
Figure 8:
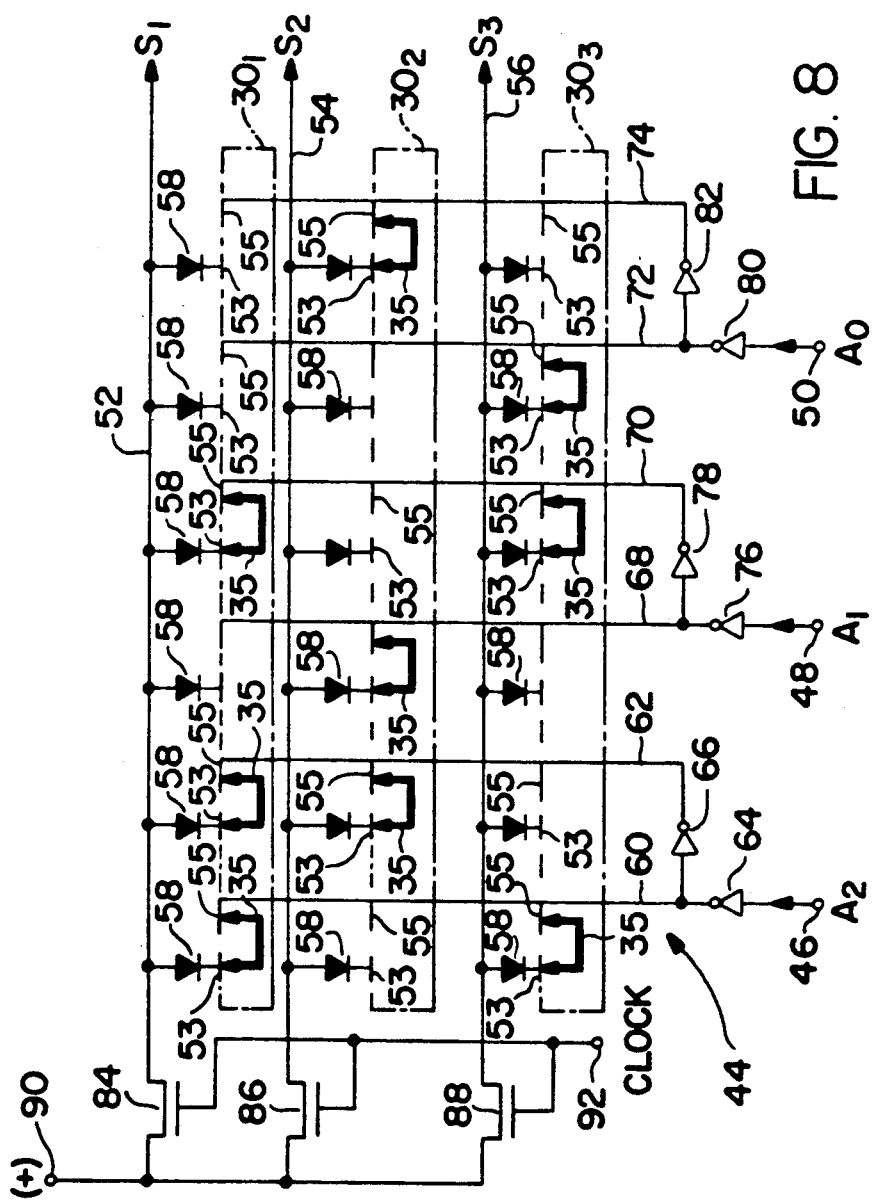

This now leads to a consideration of the details of the subject invention. The invention is directed to a cable based defect avoidance scheme which involves making interconnections between primary working sites and spare sites by shorting certain contacts on the wafer 10 after all wafer processing has been completed. This is achieved by way of the flat multi-layer cable 14 connected to the wafer 10 and involves the introduction of a passive circuit structure in the form of a patch circuit 30 as shown in FIGS. 6, 7 and 8 connected to a diode decoder circuit (FIG. 5) located on the wafer 10. The term "patch" is intended to evoke the concept of the function performed by patchboards in early state of the art computers. Accordingly, the term "patch" is herein meant to signify a functional element for the discretionary placement or removal of metal shorting connections between contact bumps on a WSI wafer 10.

The subject invention has two functional aspects. First, the cable 14 is to be arranged so as to allow enabling/addressing functions to be performed on the wafer 10 on a trial basis during manufacturing electrical tests. Secondly, the cable 14 is to have means associated therewith for allowing the formation of permanent connections which implement a selected sub-set of enabling/addressing combinations.

The first aspect, i.e. the test function, is implemented by utilizing test equipment, not shown, to close, i.e. short connections in the patch circuit in a systematic manner, thereby allowing spare sites on the wafer 10 to be tested. The second aspect, i.e. the normal use mode, is implemented by having specific shorting connections fabricated on the patch circuit, as required. An assumption is made in the specification in that the invention will be used in combination with some other wafer level discretionary technique which has prevented designated catastrophic sites from being utilized by disconnecting them from power and signal inputs. The wafer 10 thus remaining after the first discretionary operation is, moreover, assumed to have more sites available than is required to perform a desired wafer scale function. The purpose of the patch 30 is to implement an interconnection of usable circuits where is it recognized that one or more sites have failed since the initial discretionary operation, which means that such normal occurrences as failures during burn-in can be tolerated.

Figure 4A:
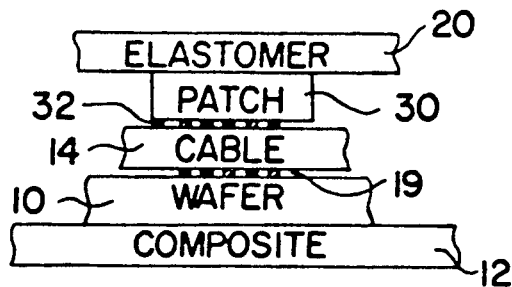
FIGS. 4A–4C are partial block diagrams generally illustrative of the physical relationship of elements in accordance with the present invention.
Figure 4B:
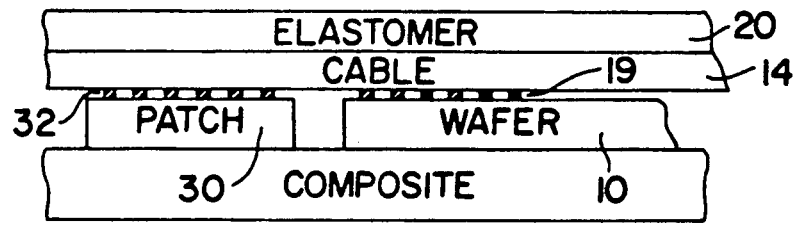
Figure 4C:
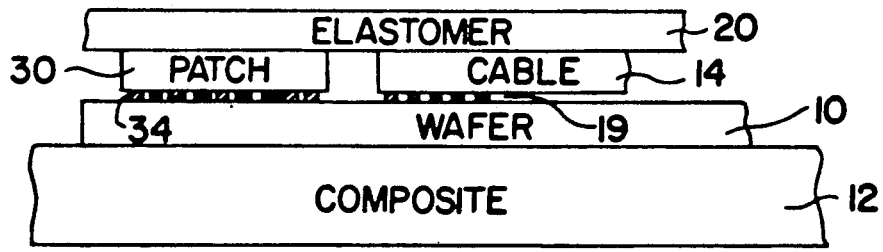

Three different configurations of a WSI package incorporating the patch 30 are shown in FIGS. 4A through 4C. As shown in FIG. 4A, the patch 30 is located on top of the cable 14 beneath the elastomer layer 20 and having a pad-bump connection interface 32 on top of the cable, while the same type of pad-bump interface 19 between the wafer 10 and the cable 14 is located on the bottom of the cable. In FIG. 4B, the patch 30 is located under the cable 14 adjacent the wafer 10 and is supported by the composite substrate 12. In this arrangement, both bump-pad interfaces 19 and 32 are located on the underside of the cable 14. Again, the elastomer layer 20 comprises the uppermost layer. With respect to the arrangement shown in FIG. 4C, it comprises a modification in that the patch 30 and the cable 14 are both located above the wafer 10, in which case the patch 30 includes a direct pad-bump interface 34 with the wafer 10, indicating that the location and even the shape of the patch 30 is variable, depending upon the specific design of the WSI module desired.

The final functional WSI circuit configuration is composed of n working sites on the wafer 10. When a particular site is to be used, it is accessed by the input of a binary address word. This address, called the "logical" address, identifies a specific "physical" site. The logical address ranges from 0 to n, and each address must be assigned to one of the available n+r physical sites.

Figure 5:
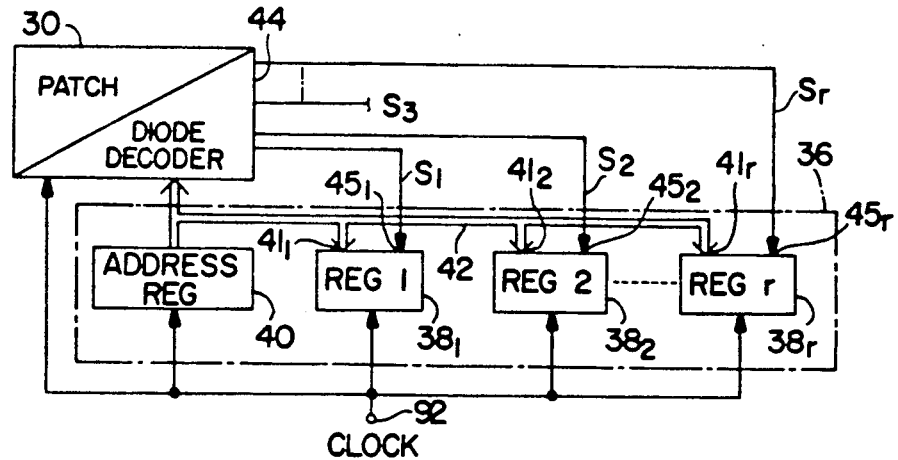
FIG. 5 is an electrical block diagram illustrative of the preferred embodiment of a spare site allocation circuit.

The circuit illustrated in FIG. 5 is illustrative of one embodiment for accomplishing the assignment of required logical addresses to physical sites required to implement a desired circuit function. FIG. 5 assumes that the n primary sites have physical addresses 0 to n−1. The r spare sites have registers $38_1$, $38_2$ . . . $38_r$ which may be loaded with an address value within the range 0 to n−1 plus at least one more address outside of the range. If a spare site register $38_i$ is loaded with an address within the range 0 to n−1, the designated spare site will functionally replace the primary site which has that physical address. If the spare site register $38_i$ is loaded with an address outside of the range 0 to n−1, the site will not be used.

The invention is embodied in FIG. 5 and serves to load the spare site registers $38_1 \ldots 38_r$ with appropriate logical addresses and operates only once during normal operation of the WSI device.

The specific logical addresses which are loaded are determined by a patch circuit 30, three embodiments of which are depicted in FIGS. 6, 7 and 8 and will be referred to hereinafter. At power turn-on, a clocked counter circuit 40, used as an address register, begins to increment from count 0 to count n. The output of the counter is bussed to the parallel load terminals $41_1$, $41_2$ ... $41_n$ of the logical address registers $38_1$, $38_2$ ... $38_r$ for at each spare site via the digital bus 42. At the same time the output of the counter is input to a decoder circuit 44. The decoder may be designed in any of several different ways, but a diode decoder is illustrated in FIGS. 6-8. The output lines $S_1$, $S_2$ ... $S_r$ of the decoder 44 are routed to respective parallel load enable inputs $45_1$, $45_2$ ... $45_r$ on the spare site registers $38_1$, $38_2$ ... $38_r$.

The decoder 44 is programmed by the patch 30 to detect a specific digital count value. When that value is encountered, an enabling signal output line $S_i$ will become active, and will enable a parallel load input $41_i$ of the associated spare site register $38_i$. Simultaneously the current digital value of the address register 40 will thus be transferred or loaded into the site register $38_i$. If the transferred value is less than n, the spare site associated with register $38_i$ will be used. On the other hand, if the transferred value is n, the spare site will still not be used. Connections, as will be shown, formed by the patch circuit 30 determine the logical address at which each line $S_1$, $S_2$ ... $S_r$ will be activated. Unused spare sites thus will have an address of n in their respective registers.

Referring now to FIGS. 6, 7 and 8, shown thereat are three embodiments of an external patch circuit 30 to complete connections within a diode decoder circuit 44 fabricated in the wafer 10. The simple case of a three binary digit address is used to illustrate the concept in each instance.

Referring now to these embodiments, attention is first directed to FIG. 6 where three address terminals 46, 48 and 50 for the digits $A_2$, $A_1$, and $A_0$ are selectively coupled by jumper type circuit connections to three enabling output signal lines $S_1$, $S_2$ and $S_3$ which are respectively coupled to three spare site registers, not shown, and which are further indicated by reference numerals 52, 54 and 56. Located therebetween is a matrix of directional diodes 58, the first two columns 60 and 62 of which are driven by inverters 64 and 66 from address terminal 46 for the digit $A_2$. In a like manner, address terminals 48 and 50 couple binary digits $A_1$ and $A_2$ to columns 68, 70 and 72, 74, respectively. In both instances, a pair of inverters 76, 78 and 80, 82 couple the respective address signals to the columns 68, 70 and 72, 74, respectively. The circuitry including the diodes 58 and the signal couplers 64 ... 82 are fabricated in the silicon wafer 10 along with three field effect transistors 84, 86 and 88, which are operable to supply a positive (+) supply potential to the diode matrix via terminal 90 when rendered conductive by a clock signal applied to terminal 92.

Further as shown in FIG. 6, the patch 30 is comprised of three segments $30_1$, $30_2$ and $30_3$, each including a line of metallization 31, a plurality of side appendages 33, and one or more straight metallized jumpers 35 which connect to cable leads 37 of the cable 14. The end segments 39 and 41 of the line of metallization 31 also connect to leads 43 and 45 which are also in the cable 14. Thus selective placement of jumpers 35 can program, i.e., encode one or more enabling signals on the respective output circuit leads 52, 54 and 56 for a particular binary address value of $A_2$, $A_1$, $A_0$ coupled to terminals 46, 48 and 50 due to the fact that whenever any diode 58 is rendered conductive by a binary signal applied to the terminals 46, 48 and 50, the respective output line 52, 54 or 56 to which it is connected via a jumper 35 goes to a binary "low" level. Any output line not connected to a conducting diode 58 for a particular input will remain "high" due to the MOSFETS 84, 86 and 88 which have been rendered conductive when a clock signal is applied to terminal 92.

Referring now to FIG. 7, shown thereat is a second embodiment of the patch circuit 30. Whereas in the first embodiment $44_1$ shown in FIG. 6 where a horizontal patch is implemented, the embodiment of FIG. 7 discloses an arrangement wherein six vertical column type patch segments $30_1$, $30_2$ ... $30_6$ are provided and include a set of selectively placed U-shaped jumpers 35 between the diodes 58 and leads 47, 49, and 51 of the cable 14 and which connect to the enabling signal lines 52, 54 and 56, respectively.

The embodiment of the patch circuit 30 as shown in FIG. 8, is an orthogonal version of that shown in FIG. 7 in that three horizontally oriented patch segments $30_1$, $30_2$ and $30_3$ are provided and include 90° rotated U-shaped jumper elements 35 between line segments 53 and 55 of the cable 14, while all other elements are implemented in the silicon of the wafer 10.

Other implementations of the patch 30 may be resorted to when desirable such as the use of an additional small strip of cable to make the desired connections. Also, it is not essential that the patch 30 be an item separate from the main interconnection cable 14, since it is possible to operate directly on a portion of the cable 14 to form the desired connections. The reason why the separate patch block concept as depicted in FIGS. 6-8 is preferred is because it permits the discretionary operations to be formed independent of the WSI assembly shown in FIGS. 1 and 2. This gives freedom in the selection of the type of discretionary operation and avoids the potential of damaging an expensive WSI assembly during programming. With respect to implementing the patch 30, the simplest way to fabricate this is at the time of electrical test and can be either a discretionary deposition of metal, or in the alternative, removal of metal.

Having thus shown and described what is at present considered to be the preferred embodiment of the invention, it should be noted that the same has been made by way of illustration and not limitation. Accordingly, all modifications, alterations and changes coming within the spirit and scope of the invention are herein meant to be included.

I claim:

1. A system for substituting a spare site for a defective site in a monolithic semiconductor device including a plurality of identical sites for implementing a predetermined circuit function comprising:

a predetermined number of primary sites in said monolithic semiconductor device having respective binary addresses;

a predetermined number of spare sites in said monolithic semiconductor device for selectively replacing a defective primary site of said primary sites, each said spare site including address means for being loaded with a binary address of said defective primary site;

means for sequentially generating a binary address signal for all said primary sites;

decoder circuit means located in said monolithic semiconductor device and being coupled to said binary address signal generating means for selectively enabling said address means of said spare sites;

patch circuit means located externally of said monolithic semiconductor device for programming said decoder circuit means to be responsive to the binary address of a defective primary site and generating an enabling signal for said address means of one predetermined spare site of said spare sites; and means coupled between said binary address signal generating means and said address means of said spare sites for loading said binary address of the defective primary site into said address means of said one predetermined spare site, whereby upon power turn on said one predetermined spare site will be substituted for the defective primary site.

2. The system of claim 1 wherein said monolithic semiconductor device comprises a wafer scale integration device.

3. The system of claim 2 wherein said decoder circuit means comprises a decoder circuit fabricated within said wafer scale integration device and said patch circuit means comprises a patch circuit located outside of said wafer scale integration device.

4. The system of claim 3 and additionally including means for interconnecting said decoder circuit and said patch circuit.

5. The system of claim 4 wherein said means for interconnecting includes a predetermined number of conductors of an electrical cable for making connections to a surface of said wafer scale integration device.

6. The system of claim 5 wherein said patch circuit includes a plurality of jumper type electrical conductors.

7. The system of claim 6 wherein said electrical cable comprises a flat cable and said patch circuit includes support means mounted on said flat cable.

8. The system of claim 7 wherein said support means includes a multiple contact interface.

9. The system of claim 8 wherein said interface comprises a pad-bump interface.

10. The system of claim 6 and wherein said decoder circuit comprises a diode decoder including a plurality of diodes selectively connectable between a plurality of binary address input means and a plurality of enabling signal output means by said jumper type electrical conductors.

11. The system of claim 10 wherein said decoder circuit includes means for applying a supply potential to said diodes and said enabling signal output means for maintaining said output means at a first binary voltage level until at least one of said diodes is rendered conductive by an address signal applied to said address input means from said binary address signal generating means at which time at least one of said output means changes to a second binary voltage level.

12. The system of claim 11 wherein said means for applying said supply potential includes semiconductor switch means coupled between a source of supply potential and a clock signal source, said switch means being rendered conductive by clock signals from said clock signal source to couple supply voltage from said source of supply potential to said diodes and said enabling signal output means.

13. The system of claim 10 wherein said address means of said spare sites comprises a respective binary storage register.

14. The system of claim 10 wherein said means for generating said binary address signals comprises a clocked address register.

15. The system of claim 10 wherein said means for generating said binary address signals comprises a clocked counter circuit used as an address register.

* * * * *